United States Patent
Matsuoka et al.

(10) Patent No.: US 12,413,066 B2
(45) Date of Patent: Sep. 9, 2025

(54) CONTROL DEVICE, PUMP UNIT, AND REFRIGERANT CIRCULATION DEVICE

(71) Applicant: Nidec Corporation, Kyoto (JP)

(72) Inventors: Masataka Matsuoka, Kyoto (JP); Makoto Itsuki, Bietigheim-Bissingen (DE); Kota Ozasa, Kyoto (JP); Hiroyuki Nagano, Kyoto (JP)

(73) Assignee: NIDEC CORPORATION, Kyoto (JP)

(*) Notice: Subject to any disclaimer, the term of this patent is extended or adjusted under 35 U.S.C. 154(b) by 90 days.

(21) Appl. No.: 18/372,269

(22) Filed: Sep. 25, 2023

(65) Prior Publication Data
US 2024/0114655 A1    Apr. 4, 2024

(30) Foreign Application Priority Data

Sep. 29, 2022    (JP) ................................ 2022-156324

(51) Int. Cl.
| | |
|---|---|
| H02M 7/44 | (2006.01) |
| H02H 3/093 | (2006.01) |
| H02H 7/085 | (2006.01) |
| H02H 9/00 | (2006.01) |

(52) U.S. Cl.
CPC ............ H02H 3/093 (2013.01); H02H 7/085 (2013.01); H02H 9/005 (2013.01)

(58) Field of Classification Search
CPC ........ H02H 3/093; H02H 7/085; H02H 9/005; H02H 9/004; F05D 2270/52; H05K 7/20272

See application file for complete search history.

(56) References Cited

U.S. PATENT DOCUMENTS

| | | | |
|---|---|---|---|
| 2007/0127177 A1* | 6/2007 | Benton | H02H 3/207 361/90 |
| 2010/0132385 A1* | 6/2010 | Yoo | H02M 1/32 62/441 |
| 2014/0287323 A1 | 9/2014 | Lu et al. | |
| 2021/0218244 A1* | 7/2021 | Marcinkiewicz | H02H 9/045 |

FOREIGN PATENT DOCUMENTS

| | | |
|---|---|---|
| JP | 2012090448 A | 5/2012 |
| JP | 2015505861 A | 2/2015 |
| JP | 2017093085 A | 5/2017 |

OTHER PUBLICATIONS

Official Communication issued in corresponding Japanese Patent Application No. 2022-156324, mailed on Jan. 7, 2025, 3 pages.

\* cited by examiner

*Primary Examiner* — Muhammad S Islam
(74) *Attorney, Agent, or Firm* — Keating & Bennett, LLP

(57) ABSTRACT

A technology of starting power supply from an external device to a load device in a shorter period, after detection of connection between the external device and the load device, is provided. A control device includes a first connector attachable to and detachable from an external device, a power supply path to electrically connect a load device and the first connector, a load switch to switch between connection and disconnection of the power supply path, a protection circuit to protect the load switch from an inrush current to the load switch, the protection circuit including at least a capacitor, and a control circuit. The control circuit is operable to switch the load switch from disconnection to connection after a total time of a preset set time and a first time based on a charging time of the capacitor which has elapsed since connection of the first connector to the external device was detected.

8 Claims, 7 Drawing Sheets

CONTROL DEVICE, PUMP UNIT, AND REFRIGERANT CIRCULATION DEVICE

CROSS-REFERENCE TO RELATED APPLICATIONS

The present application claims priority under 35 U.S.C. § 119 to Japanese Patent Application No. 2022-156324, filed on Sep. 29, 2022, the entire contents of which are hereby incorporated herein by reference.

1. Field of the Invention

The present disclosure relates to a control device, a pump unit, and a refrigerant circulation device.

2. Background

Conventionally, a hot plug function of a disk drive in a redundant array of inexpensive disks (RAID) system is known. In a RAID system, a power-on delay circuit controls power supply to a disk drive when the disk drive is inserted into an array. Specifically, the power-on delay circuit detects that connection is established between the hard drive and the backplane connector of the array. When a connection is first sensed, the power-on delay circuit starts clocking a predetermined time (that is, timeout). Power to the disk drive is applied via a solid state switch only when a predetermined time of the power-on delay circuit has elapsed.

Conventionally, power is supplied from an external device (that is, RAID system) to a load device (that is, disk drive) in response to elapse of a predetermined time from initial detection of connection between the external device and the load device. The length of the predetermined time is required to be as short as possible, but the length of the predetermined time is not known.

SUMMARY

A control device according to one example embodiment of the present disclosure includes a first connector, a power supply path, a load switch, a protection circuit to protect the load switch from an inrush current to the load switch, and a control circuit. An external device is attachable to and detachable from the first connector. The power supply path electrically connects a load device and the first connector. The load switch is switchable between connection and disconnection of the power supply path. The protection circuit includes at least a capacitor. The control circuit is operable to switch the load switch from disconnection to connection after a total time of a preset set time and a first time based on a charging time of the capacitor which has elapsed since connection of the first connector to the external device was detected.

A pump assembly according to another example embodiment of the present disclosure includes a first connector, a motor, a pump rotor, a power supply path, a load switch, a protection circuit to protect the load switch from an inrush current to the load switch, and a control circuit. The first connector is attachable to and detachable from an external device. The pump rotor is rotatable by power generated by the motor. The power supply path is electrically connected between the motor and the first connector. The load switch is operable to switch between connection and disconnection of the power supply path. The protection circuit includes at least a capacitor. The control circuit is operable to switch the load switch from disconnection to connection after the total time of a preset set time and a first time based on the charging time of the capacitor has elapsed since connection of the first connector to the external device was detected. The motor generates the power in response to the load switch being switched to connection.

A refrigerant circulation device according to still another example embodiment of the present disclosure includes a pump assembly and a flow path. In the flow path, the refrigerant flows by rotation of the pump rotor.

The above and other elements, features, steps, characteristics and advantages of the present disclosure will become more apparent from the following detailed description of the example embodiments with reference to the attached drawings.

DETAILED DESCRIPTION

Figure 1:
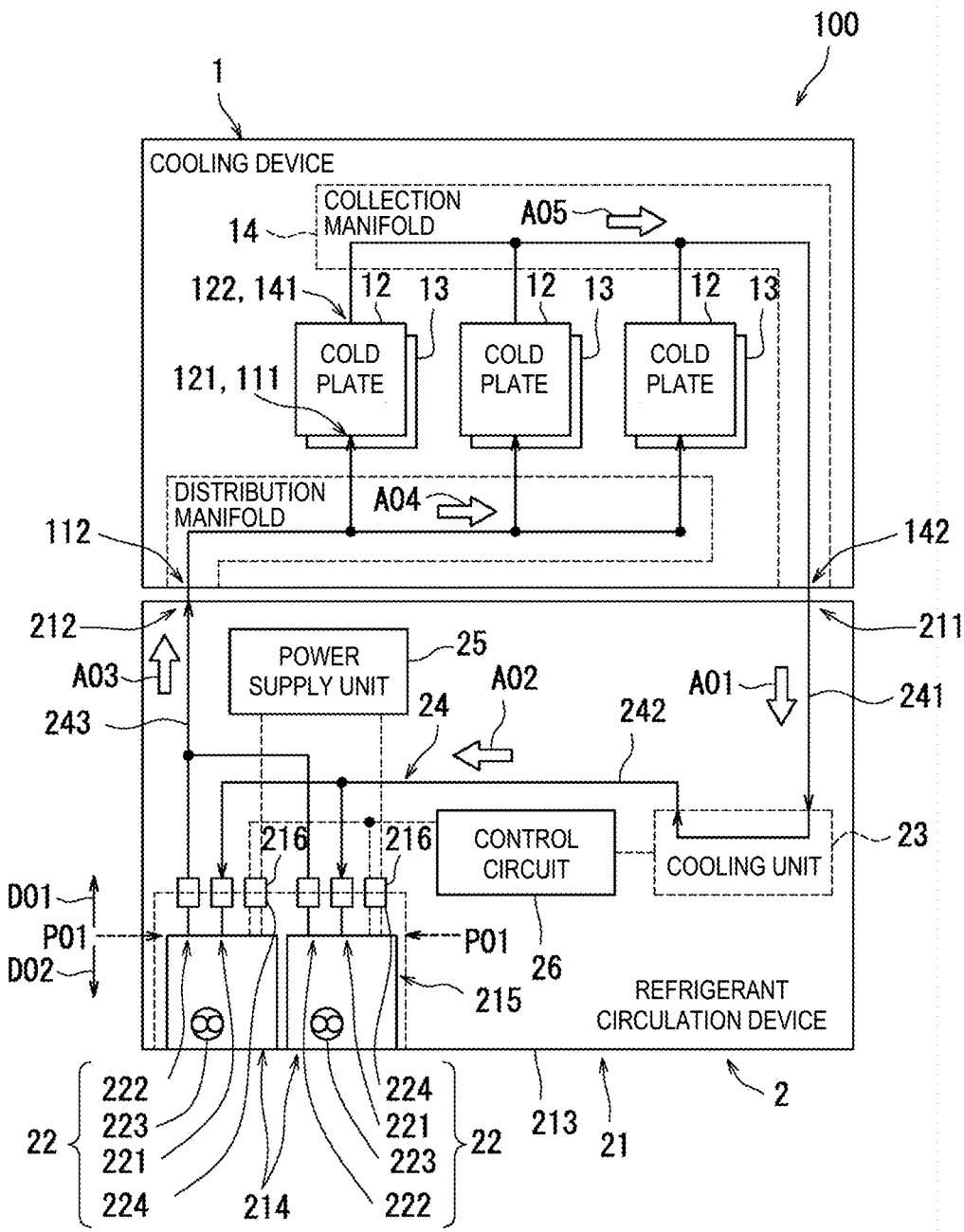
FIG. 1 is a block diagram illustrating a configuration of a cooling system according to an example embodiment of the present disclosure.

Hereinafter, example embodiments of the present disclosure will be described with reference to the drawings. In the drawings, the same or corresponding parts are denoted by the same reference numerals, and the description will not be repeated.

FIG. 1 is a block diagram illustrating a configuration of a cooling system 100 according to an example embodiment of the present disclosure. The cooling system 100 includes a cooling device 1 and a refrigerant circulation device 2.

The cooling device 1 includes a distribution manifold 11, a plurality of cold plates 12, a plurality of heat sources 13, and a collection manifold 14. The number of each of the cold plates 12 and the heat sources 13 may be at least one.

In the cooling system 100, the refrigerant circulates among the refrigerant circulation device 2, the distribution manifold 11, the plurality of cold plates 12, and the collection manifold 14 as indicated by a plurality of arrows A01 to A05. The refrigerant is, for example, a coolant. Examples of the coolant include antifreeze liquid and pure water. A typical example of antifreeze liquid is an ethylene glycol aqueous solution or a propylene glycol aqueous solution. High-temperature refrigerant flows into the refrigerant circulation device 2 from the collection manifold 14 (see arrow A01). The refrigerant circulation device 2 pressurizes and cools the refrigerant. When the refrigerant is pressurized, the refrigerant circulates in the cooling system 100 (see arrows A01 to A05). Specifically, the low-temperature refrigerant flows into the plurality of cold plates 12 via the distribution manifold 11 (see arrow A04) and flows through the plurality of cold plates 12. The plurality of cold plates 12 are in thermal contact with the plurality of heat sources 13. Each heat source 13 is a device that generates heat. In the example embodiments, each heat source 13 is a component of a computing device. Examples of the heat source 13 include an electrolytic capacitor, a power semiconductor module, and a printed circuit board.

Each of the cold plates 12 has an inflow port 121 and an outflow port 122. In FIG. 1, for convenience, reference numerals "121" and "122" are representatively given to only one cold plate 12. The refrigerant flows into each of the inflow ports 121 from the downstream end 111 of the distribution manifold 11 (see arrow A04). The refrigerant flows from the inflow port 121 toward the outflow port 122 at each cold plate 12. Accordingly, the heat generated by the heat source 13 moves to the refrigerant flowing in each cold plate 12. That is, the temperature of the refrigerant becomes high. The high-temperature refrigerant flows out from each outflow port 122 to each upstream end 141 of the collection manifold 14 and flows in the collection manifold 14 (see arrow A05).

The refrigerant circulation device 2 includes a casing 21, two pump assemblies 22, a cooling unit 23, a flow path 24 including pipes 241 to 243, a power supply unit 25, and a control circuit 26. A portion of the refrigerant circulation device 2 excluding the pump assembly 22 is an example of an "external device" of the present disclosure.

The casing 21 has an inflow port 211 for refrigerant and an outflow port 212 for refrigerant. The inflow port 211 is connected with a downstream end 142 of the collection manifold 14. The refrigerant flows into the inflow port 211 from the downstream end 142. The outflow port 212 is connected with an upstream end 112 of the distribution manifold 11. The refrigerant flows out from the outflow port 212 to the upstream end 112.

The casing 21 accommodates the two pump assemblies 22 and the cooling unit 23. The cooling unit 23 and the respective pump assemblies 22 are connected between the inflow port 211 and the outflow port 212 by the pipes 241 to 243. As a result, in the casing 21 (that is, the cooling device 1), the refrigerant can flow from the inflow port 211 to the outflow port 212 via the cooling unit 23 and the respective pump assemblies 22 sequentially (see arrows A01 to A03).

Each pump assembly 22 has a suction port 221, a discharge port 222, and a pump rotor 223 to pressurize the refrigerant in the pipes 241 to 243. The suction port 221 is connected to the downstream end of the pipe 242. The discharge port 222 is connected to the upstream end of the pipe 243. In the pump assembly 22, the pump rotor 223 rotates to apply pressure to the refrigerant in the pump assembly 22. As a result, the refrigerant in the pipe 242 is sucked from the suction port 221. The sucked refrigerant is discharged from the discharge port 222 to the pipe 243.

The type of the pump assembly 22 is not particularly limited. That is, the pump assembly 22, for example, a centrifugal pump, a propeller pump, a viscous pump, or a rotary pump can be adopted. The pump rotor 223 is an impeller when the pump assembly 22 is a centrifugal pump, a propeller pump, a viscous pump, or a gear pump. The pump rotor 223 is a screw when the pump assembly 22 is a screw pump. The number of pump assemblies 22 may be at least one.

The cooling unit 23 cools the refrigerant flowing in the refrigerant circulation device 2. The type of the cooling unit 23 is not particularly limited. That is, as the cooling unit 23, an air cooling system or a water cooling system can be adopted. In the case of the air cooling system, the cooling unit 23 includes a radiator and a fan. The radiator is connected to the downstream end of the pipe 241. High-temperature refrigerant flows into the radiator from the downstream end of the pipe 241. The radiator is connected to the upstream end of the pipe 242. The radiator guides the refrigerant flowing in from its own inflow port to its own outflow port. In the process, the refrigerant flowing in the radiator is cooled by the airflow generated by the fan. As a result, low-temperature refrigerant flows out from the outflow port of the radiator.

The power supply unit 25 is a power supply circuit or the like, and generates, for example, a DC voltage Vcc from an AC voltage supplied from, for example, a commercial power supply. The value of the DC voltage Vcc is not particularly limited, and is, for example, 54 V. The power supply unit 25 supplies the generated DC voltage Vcc to each pump assembly 22 and the cooling unit 23.

The control circuit 26 includes a microcomputer, a memory, and the like, not illustrated. The microcomputer operates according to a program stored in the memory and controls the operation of each pump assembly 22 and the cooling unit 23.

Figure 2:
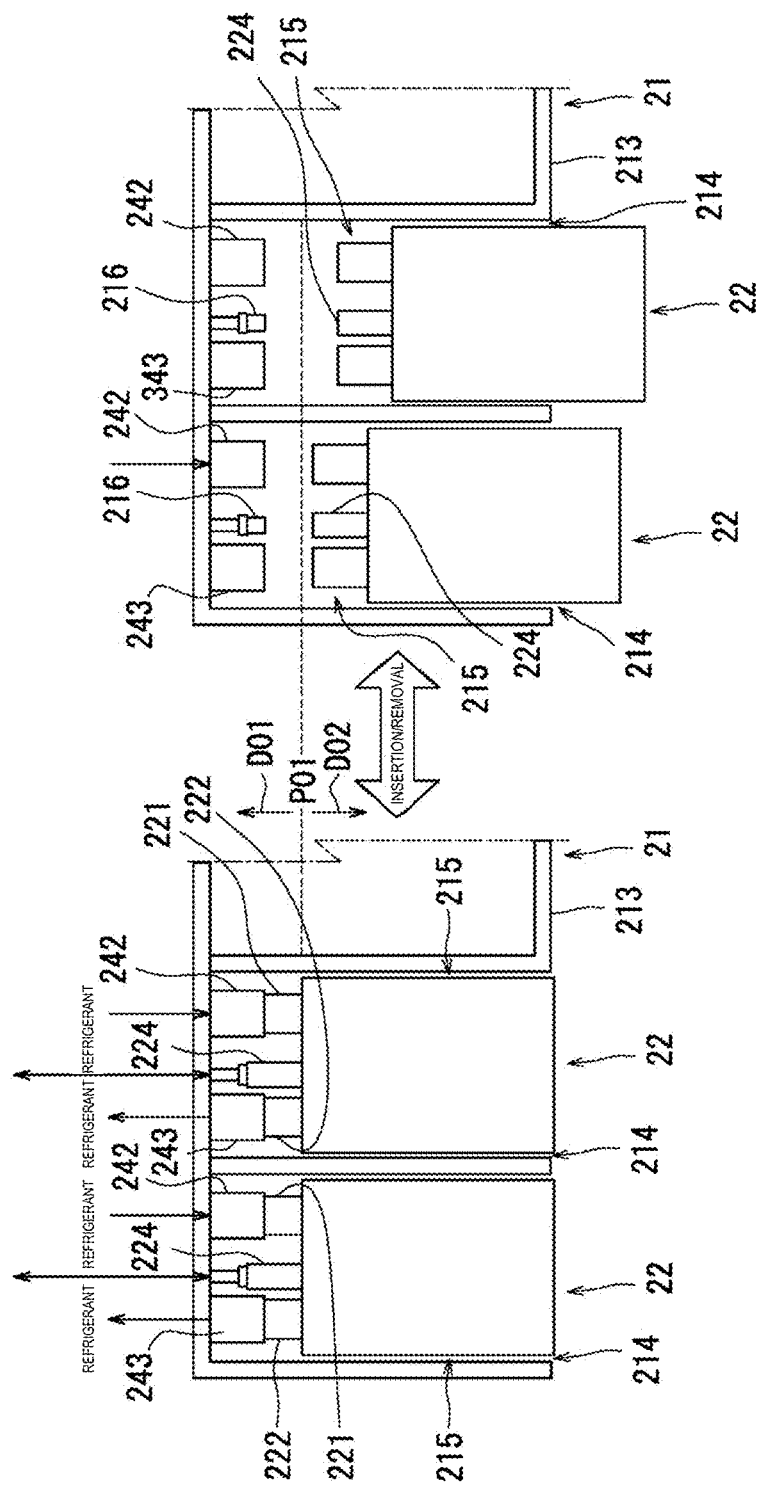
FIG. 2 is a schematic view illustrating insertion and removal of a casing and each pump assembly according to an example embodiment of the present disclosure in detail.

FIG. 2 is a schematic view illustrating insertion and removal of a casing 21 and each pump assembly 22 in detail. As illustrated in FIGS. 1 and 2, the casing 21 has a predetermined shape. The predetermined shape is, for example, a substantially rectangular parallelepiped shape. On a first surface 213 of the casing 21, the number of openings 214 corresponding to the number of the pump assemblies 22 is formed. An accommodation space 215 is formed from each opening 214 toward the inside of the casing 21. Each pump assembly 22 is movable by a human hand in the approaching direction D01 and the separation direction D02 in the accommodation space 215 through the opening 214. The approaching direction D01 is a direction from the opening 214 toward a mounting position P01 defined in advance in the accommodation space 215. The separation direction D02 is a direction opposite to the approaching direction D01 and is a direction from the mounting position P01 toward the opening 214. The downstream end of the pipe 242, the upstream end of the pipe 243, and the connector 216 are disposed at the back of the accommodation space 215. The connector 216 is an example of a "second connector" in the present disclosure. Note that details of the connector 216 will be described later.

The pump assembly 22 has a shape corresponding to the opening 214 and the accommodation space 215, that is, a substantially rectangular parallelepiped shape. In a state where each pump assembly 22 is located at the mounting position P01, the suction port 221 of the pump assembly 22 is connected to the downstream end of the pipe 242, and the discharge port 222 of the pump assembly 22 is connected to the upstream end of the pipe 243. Each pump assembly 22 is further fixed to the first surface 213 with a fixing tool such as a screw (not illustrated) in a state of being located at the mounting position P01. As a result, the refrigerant can flow from the pipe 242 to the suction port 221, and the refrigerant can flow from the discharge port 222 to the pipe 243. Since each pump assembly 22 is fixed to the first surface 213, the pipe 242 is prevented from coming out from the suction port 221 and the pipe 243 is prevented from coming out from the discharge port 222.

Each pump assembly 22 further includes a connector 224 attachable to and detachable from the connector 216 (that is, an external device). The connector 224 is an example of a "first connector" in the present disclosure. When the pump assembly 22 moves in the approaching direction D01 and is located at the mounting position P01, the connector 224 is electrically connected to the connector 216. While the pump assembly 22 moves from the mounting position P01 in the separation direction D02, the connector 224 is removed from the connector 216. Note that the details of the connector 224 will be described later.

Figure 3:
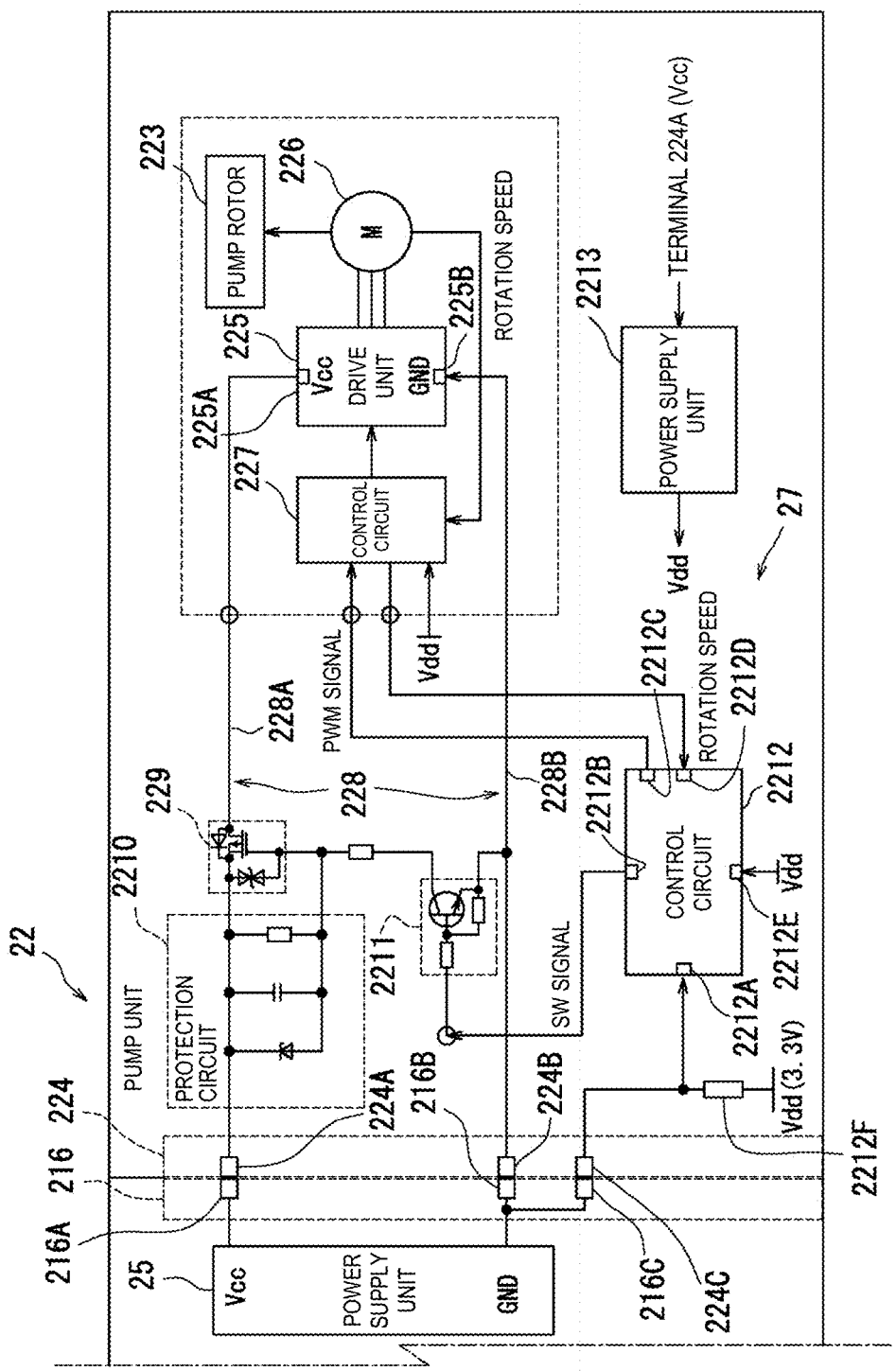
FIG. 3 is a block diagram illustrating a detailed configuration of a pump assembly illustrated in FIGS. 1 and 2.

FIG. 3 is a block diagram illustrating a detailed configuration of the pump assembly 22 illustrated in FIGS. 1 and 2.

FIG. 3 illustrates the connector 216 and the power supply unit 25 in addition to the detailed configuration of the pump assembly 22. The connector 216 includes at least terminals 216A to 216C. The DC voltage Vcc generated by the power supply unit 25 is applied between the terminals 216A and 216B. Among the terminals 216A to 216C, the terminals 216B and 216C are grounded. Specifically, the terminals 216B and 216C are electrically connected to the ground in the power supply unit 25. Note that the terminal 216C is an example of a "second detection terminal" in the present disclosure.

As illustrated in FIG. 3, the pump assembly 22 includes a power supply unit 2213, a drive unit 225, a motor 226, a control circuit 227, a power supply path 228, a load switch 229, a protection circuit 2210, a drive unit 2211, and a control circuit 2212, in addition to the pump rotor 223 and the connector 224 described above. At least the connector 224, the power supply path 228, the load switch 229, the protection circuit 2210, and the control circuit 2212 constitute a control device 27.

The connector 224 includes at least terminals 224A to 224C. The terminals 224A, 224B, and 224C are electrically connected to the terminals 216A, 216B, and 216C when the connectors 216 and 224 are electrically connected. Here, the timing at which the terminals 216B and 224B conduct in the process of connecting the connectors 216 and 224 to each other substantially coincides with the timing at which the terminals 216A and 224A conduct. On the other hand, for example, since the terminal 216C is formed in a shape different from that of the terminal 216A, the timing at which the terminals 216C and 224C conduct is delayed by a predetermined time from the timing at which the terminals 216A and 224A conduct. Note that the terminal 224C is an example of a "first detection terminal" in the present disclosure.

The power supply unit 2213 is a power supply circuit or the like, and generates a DC voltage Vdd from the DC voltage Vcc supplied from the terminal 224A. The value of the DC voltage Vdd is not particularly limited, but is lower than the withstand voltage of each microcomputer of the control circuits 227 and 2212. The DC voltage Vdd is lower than the DC voltage Vcc, for example, 3.3 V. The DC voltage Vdd is supplied to the control circuit 2212. The control circuit 2212 operates with the DC voltage Vdd. Note that the power supply unit 2213 may be a battery that outputs the DC voltage Vdd instead of the power supply circuit.

The drive unit 225 is, for example, an H-bridge circuit. The drive unit 225 includes terminals 225A and 225B. In the drive unit 225, a drive voltage based on the DC voltage Vcc is applied between the terminals 225A and 225B through the connector 224 or the like, in response to the elapse of a predetermined time after the connector 216 and 224 is electrically connected. In the H-bridge circuit, the four switching elements are turned on and off under the control by the control circuit 227. As a result, the drive unit 225 controls the direction of the current flowing through the motor 226 and the rotation speed of the motor 226.

The motor 226 has a rotatable output shaft. The pump rotor 223 is mechanically connected to the output shaft. The motor 226 rotates under the control of the drive unit 225 to generate power. The motor 226 is an example of a "load device" of the present disclosure. As is well known, the motor 226 detects the rotation speed of the output shaft, and outputs a signal indicating the detected rotation speed (hereinafter, it is simply referred to as "rotation speed") to the control circuit 227.

The pump rotor 223 rotates by the power generated by the motor 226.

The control circuit 227 includes a microcomputer, a memory, and the like, not illustrated. The microcomputer operates according to a program stored in the memory. Specifically, the control circuit 227 outputs the rotational speed input from the motor 226 to the control circuit 2212. In addition, the control circuit 227 turns on and off each switching element included in the H-bridge circuit on the basis of a pulse width modulation (PWM) signal output from the control circuit 2212. The PWM signal is an example of a "pulse signal" in the present disclosure. Furthermore, the control circuit 227 may be integrated with the control circuit 2212.

The power supply path 228 electrically connects the motor 226 (that is, a load device) and the connector 224. Specifically, the power supply path 228 includes two power lines 228A and 228B. The power line 228A electrically connects the terminals 224A and 225A. The power line 228B electrically connects the terminals 224B and 225B.

The load switch 229 switches between connection and disconnection of the power supply path 228. Specifically, the load switch 229 is provided on the power line 228A. The load switch 229 typically includes a metal oxide semiconductor field effect transistor (MOSFET). In the MOSFET, the source is disposed on the input side of the DC voltage Vcc. That is, the source is electrically connected to the terminal 224A. The drain is disposed on the output side of the DC voltage Vcc. That is, the drain is connected to the Vcc terminal of the drive unit 225. The gate is electrically connected to a drive unit 2211 described later. In response to a high-level switch signal being output from the control circuit 2212 to the drive unit 2211, a current flows between the collector and the emitter of the NPN transistor in the drive unit 2211, and as a result, a current flows between the source and the drain of the load switch 229.

The protection circuit 2210 protects the load switch 229 from an inrush current that may flow through the load switch 229 when the connectors 224 and 216 are connected to each other. The protection circuit 2210 may include at least a capacitor. In the example embodiment, the protection circuit 2210 includes a diode, a capacitor, and a resistor. The diode, the capacitor, and the resistor are all connected between the connector 224 and the load switch 229 and between the load switch 229 and the drive unit 2211 in the power line 228A.

The drive unit 2211 controls on/off of the load switch 229 (that is, MOSFET). Specifically, the drive unit 2211 includes an NPN transistor. In the NPN transistor, the collector is electrically connected to the gate of the MOSFET via the resistor. The emitter is electrically connected to the power line 228B. The base is electrically connected to a terminal 2212B in the control circuit 2212.

Note that the drive unit 2211 can also be realized using a PNP transistor and a photocoupler, as is well known, besides the NPN transistor.

The control circuit 2212 includes a microcomputer, a memory, and the like, not illustrated. The microcomputer has at least terminals 2212A to 2212E. The microcomputer operates by the DC voltage Vdd supplied to the terminal 2212E. The operation of the microcomputer is defined by a program stored in the memory.

The terminal 2212A is an input terminal of a hot plug signal (hereinafter referred to as an "HP signal"). The terminal 2212A is electrically connected to the terminal 224C. In addition, a DC voltage Vdd generated by the power supply unit 2213 is supplied to the terminal 2212A via a pull-up resistor 2212F. Therefore, when the terminals 216C and 224C are not electrically connected to each other (that is, in a case where the pump assembly 22 is not mounted on the casing 21), the DC voltage Vdd is input to the terminal 2212A. That is, an HP signal is at a high level (DC voltage Vdd). On the other hand, when the terminals 216C and 224C are electrically connected to each other, the terminal 2212A is connected to the ground of the power supply unit 25. That is, an HP signal is at a low level (0 V).

The terminal 2212B is an output terminal for a switch signal (hereinafter referred to as an "SW signal"). In the control circuit 2212, the microcomputer incorporates a timer. The timer may be an integrated circuit externally attached to the microcomputer. The timer starts clocking with transition of the HP signal from a high level to a low level as a trigger. The microcomputer outputs a high-level SW signal from the terminal 2212B in response to the value of the timer reaching a set time having been set.

The terminal 2212C is an input terminal for the rotation speed. The terminal 2212D is an output terminal for a PWM signal. The microcomputer outputs, to the control circuit 227, a pulse width modulation (PWM) signal whose pulse width is adjusted so that the actual rotation speed of the motor 226 approaches the target rotation speed of the motor 226.

Figure 4:
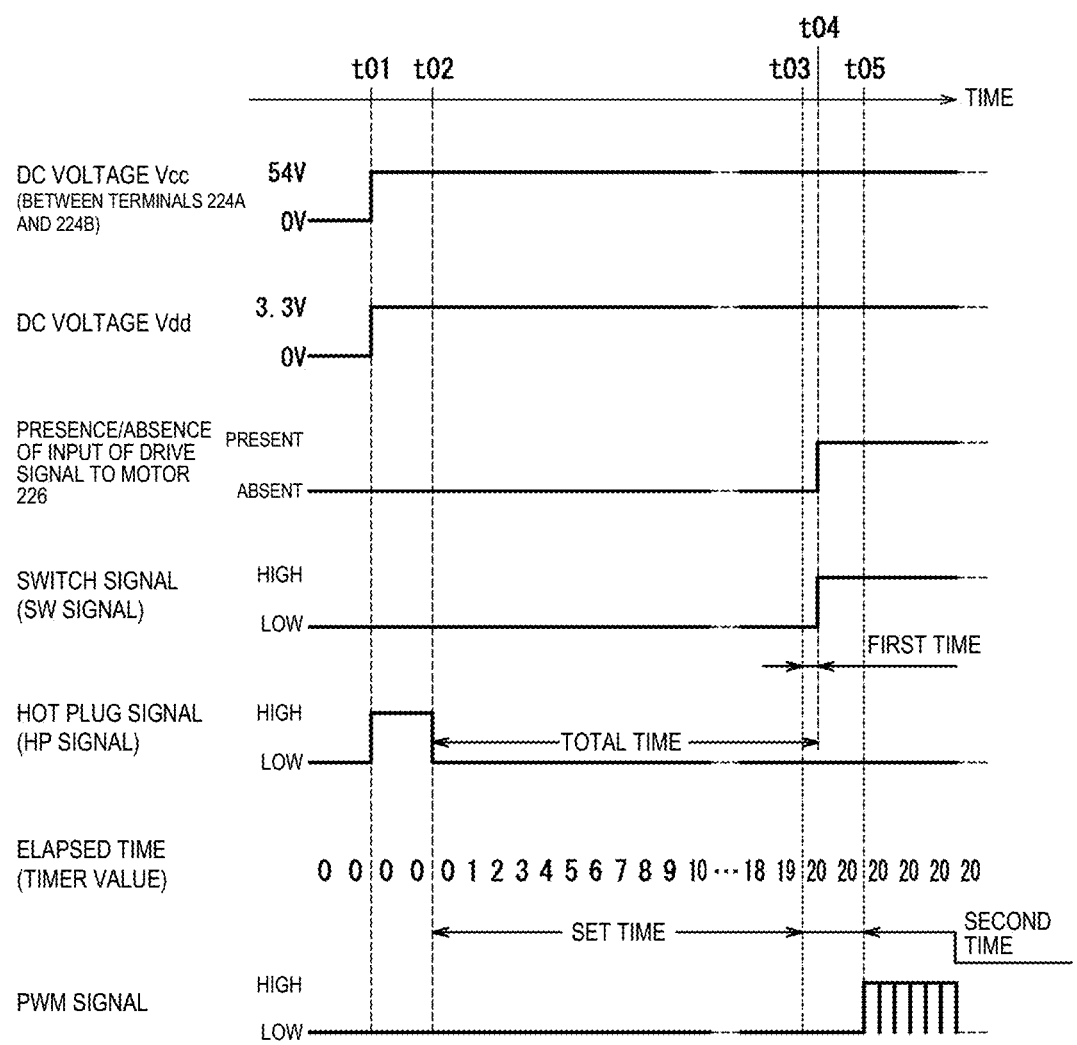
FIG. 4 is a timing chart illustrating an operation when the pump assembly is attached to the casing in the refrigerant circulation device illustrated in FIG. 1.

FIG. 4 is a timing chart illustrating an operation when the pump assembly 22 is mounted on the casing 21 in the refrigerant circulation device 2 illustrated in FIG. 1.

As illustrated in FIG. 4, it is assumed that the pump assembly 22 is not mounted on the casing 21 before time t01. That is, the connector 216 is not connected to the connector 224 (see FIG. 2). Therefore, the DC voltage Vcc is not applied between the terminals 224A and 224B (see FIG. 3). The DC voltage Vdd is 0 V. No drive signal is input to the motor 226 (that is, a load device). Both the SW signal and the HP signal are at a low level. Therefore, the load switch 229 does not connect the power line 228A. Further, at time t01, the control circuit 2212 does not start clocking by the timer and does not output a PWM signal.

Before time t01, it is assumed that a main power switch (not illustrated) provided in the casing 21 is operated by an operator. Therefore, in the connector 216, the DC voltage Vcc generated by the power supply unit 25 appears between the terminals 216A and 216B.

At time t01, the operator inserts the pump assembly 22 into the accommodation space 215 of the casing 21 and moves the pump assembly 22 to the mounting position P01 (see FIG. 2). Therefore, among the terminals 224A, 224B, and 224C (see FIG. 3), the terminals 224A and 224B are electrically connected to the terminals 216A and 216B, respectively. As a result, the DC voltage Vcc is applied between the terminals 224A and 224B. In addition, the power supply unit 2213 generates a DC voltage Vdd from the DC voltage Vcc and provides the DC voltage Vdd to the control circuits 227 and 2212. The control circuits 227 and 2212 start operation with the DC voltage Vdd generated by the power supply unit 2213. Thereafter, the control circuit 227 waits for input of a PWM signal from the control circuit 2212 and the rotation speed from the motor 226. The control circuit 2212 starts monitoring of the HP signal. The HP signal goes to a high level after the DC voltage Vdd is input until the terminals 216C and 224C are electrically connected to each other.

After time t01, it is assumed that the terminals 216C and 224C are electrically connected at time t02. The control circuit 2212 detects the conduction of the terminals 216C and 224C (that is, the connector 224 is connected to the connector 216) based on the voltage value of the terminal 2212A. Specifically, when the terminals 216C and 224C are electrically connected, the HP signal transitions from a high level to a low level. The control circuit 2212 recognizes that the HP signal has transitioned from a high level to a low level based on the voltage of the terminal 2212A. With this recognition, the control circuit 2212 detects that the connector 224 is connected to the connector 216. In this manner, the control circuit 2212 can easily detect attachment and detachment of the connector 224 to and from the connector 216. In addition, the control circuit 2212 starts clocking by a timer with detection of connection as a trigger. The control circuit 2212 periodically monitors the elapsed time measured by the timer.

After time t02, at time t03, when the control circuit 2212 recognizes that the timer has reached a set time ("20" in the drawing), the control circuit outputs a high-level SW signal from the terminal 2212B. The drive unit 2211 gives a drive signal to the gate of the load switch 229 in response to the input of the high-level SW signal. However, the protection circuit 2210 is provided in front of the load switch 229. Therefore, immediately after the drive signal is applied to the load switch 229, a current flows through the capacitor of the protection circuit 2210, and the capacitor is charged. That is, the load switch 229 is slowly switched from disconnection to connection. As a result, an inrush current is prevented from flowing through the load switch 229 and the drive unit 225. As a result, the power supply unit 25 is prevented from stopping or the drive unit 225 is prevented from being damaged by the spark.

A time at which the first time has elapsed from time t03 is defined as t04. The first time is a predetermined time, and is a time based on the charging time of the capacitor of the protection circuit 2210. Specifically, the first time is the charging time itself of the capacitor, a time slightly shorter than the charging time of the capacitor, or a time slightly longer than the charging time of the capacitor. When the capacitor is fully charged or nearly fully charged at time t04, the load switch 229 is switched to connection. As a result, a DC voltage Vcc is applied between the gate and the source of the MOSFET of the load switch 229 and between the terminals 225A and 225B of the drive unit 225. That is, in the load switch 229, after the control circuit 2212 detects that the connector 224 is connected to the connector 216 (that is, an external device), the load switch 229 is switched from disconnection to connection after the total time of the set time and the first time has elapsed. The first time is a time based on the charging time of the capacitor. As a result, after the connection with the external device is detected, the power supply from the external device to the component (that is, the motor 226) is started in a shorter time. Specifically, it is possible to relatively shorten the time during which the load switch 229 is disconnected while preventing an inrush current from flowing. As a result, power supply to the motor 226 is started relatively early.

In addition, the load switch 229 is in a disconnected state during the total time. As a result, power can be supplied to the motor 226 after the connection state between the connectors 216 and 224 is stabilized.

A time at which the second time has elapsed from time t03 is defined as t05. The second time is a preset time. Specifically, the second time is shorter than the set time and slightly longer than the first time. When recognizing that the second time has elapsed, the control circuit 2212 starts outputting of a PWM signal to the control circuit 227. Since the start of outputting of the PWM signal is delayed from the connection of the load switch 229, the operation of the motor 226 is stabilized. As a result, the motor 226 is driven by the drive unit 225 to start rotation of the pump rotor 223. Thereafter, the control circuit 2212 outputs, to the control circuit 227, the PWM signal whose pulse width is adjusted based on the rotation speed from the control circuit 227.

In addition, since the second time is shorter than the set time, the power supply to the motor 226 is started relatively early.

Figure 5:
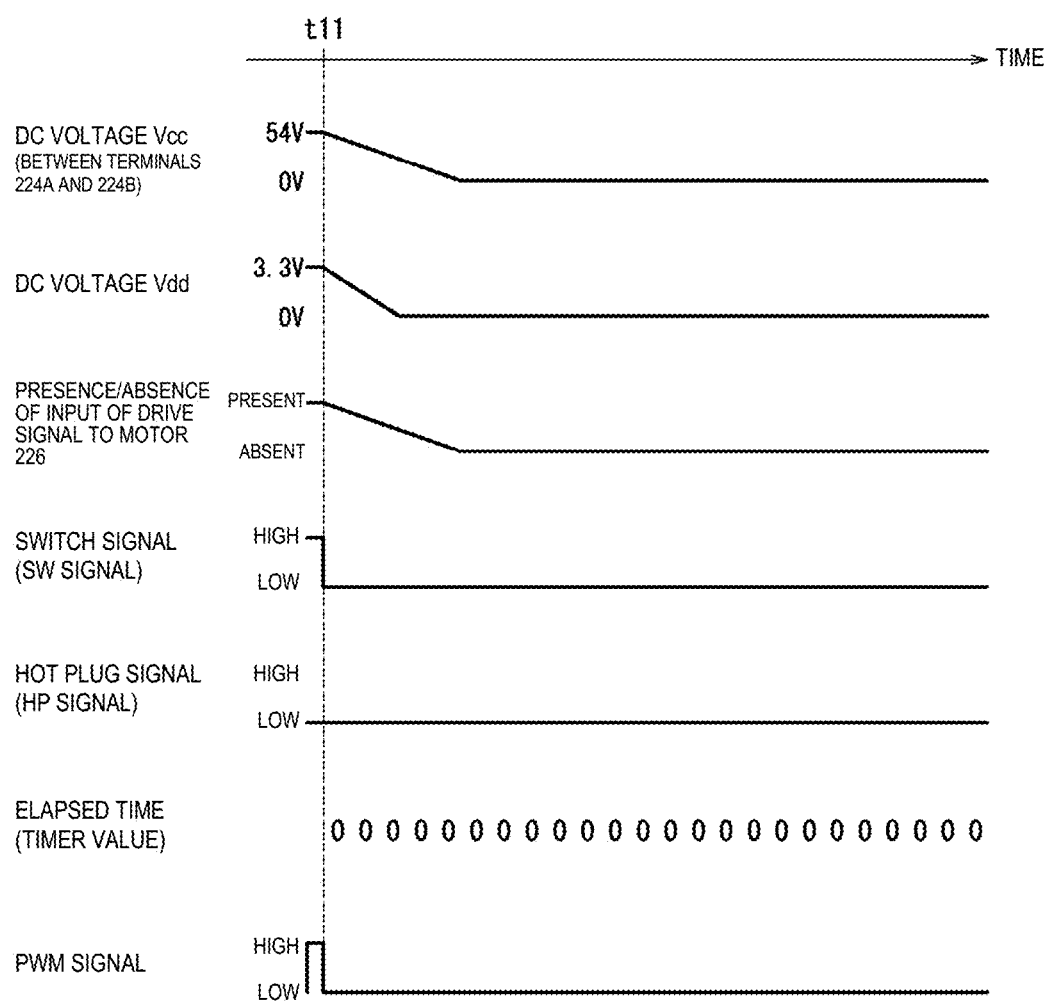
FIG. 5 is a timing chart illustrating an operation when the main power switch of the casing is turned off in the refrigerant circulation device illustrated in FIG. 1.

FIG. 5 is a timing chart illustrating an operation when the main power switch of the casing 21 is turned off in the refrigerant circulation device 2 illustrated in FIG. 1.

As illustrated in FIG. 5, it is assumed that the pump assembly 22 is mounted on the casing 21 before time t11. That is, the connector 216 is connected to the connector 224 (see FIG. 2). Therefore, the DC voltage Vcc is applied between the terminals 224A and 224B (see FIG. 3). The DC voltage Vdd is 3.3 V. It is also assumed that a drive signal to the motor 226 (that is, a load device) is input. Therefore, the load switch 229 is connected to the power line 228A. Further, the SW signal is at a high level, but the HP signal is at a low level. At time t11, the control circuit 2212 keeps clocking the set time.

At time t11, the operator turns off the main power switch of the casing 21. The DC voltage Vcc and the power supplied to the motor 226 start to decrease. The DC voltage Vdd also starts to decrease from 3.3 V toward 0 V. Since the connectors 216 and 224 are connected to each other, the HP signal remains at a low level. When the DC voltage Vdd starts to decrease, the control circuit 2212 detects that the main power switch is turned off or that connector 224 is removed from the connector 216. In response to the detection, the control circuit 2212 starts outputting of the low-level SW signal, stops outputting of the PWM signal, and further initializes the timer ("0" in the drawing).

Figure 6:
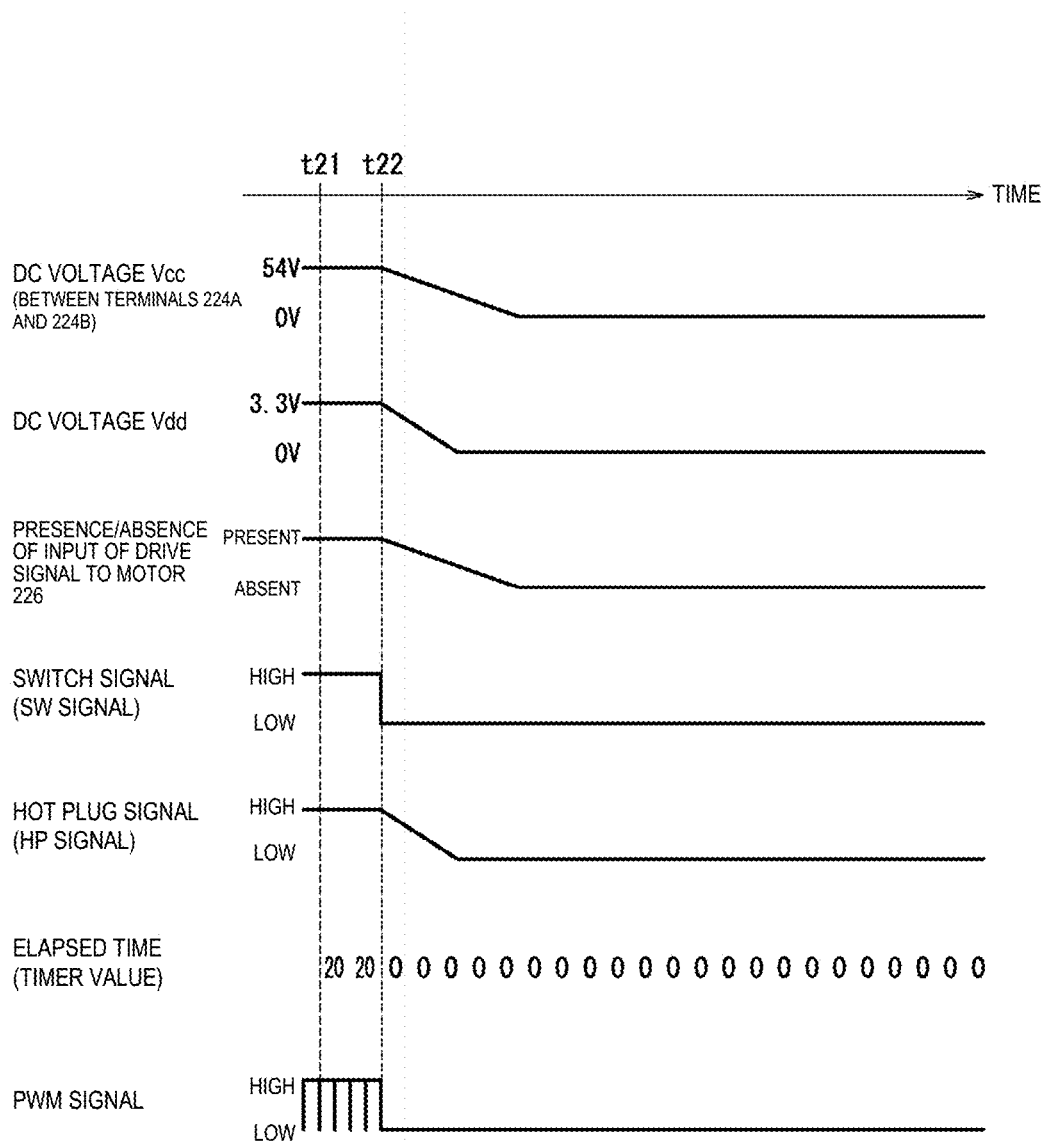
FIG. 6 is a timing chart illustrating an operation when the pump assembly is removed from the casing in the refrigerant circulation device illustrated in FIG. 1.

FIG. 6 is a timing chart illustrating the operation when the pump assembly 22 is removed from the casing 21 in the refrigerant circulation device 2 illustrated in FIG. 1.

As illustrated in FIG. 6, before time t21, the refrigerant circulation device 2 is in the same state as that before time t11 (see FIG. 5). At time t21, the operator starts to remove the pump assembly 22 from the accommodation space 215 (see FIG. 2). As a result, the pump assembly 22 moves in the separation direction D02 (see FIG. 2) from the mounting position P01. In the process of moving in the separation direction D02, among the terminals 216A to 216C, first, the terminal 224C is separated from the terminal 216C, and the terminals 224A and 224B are separated from the terminals 216A and 216B, respectively, with a time difference. Therefore, the HP signal input to the terminal 2212A transitions from the low level to the high level (that is, the DC voltage Vdd) in response to the terminal 224C being separated from the terminal 216C, and thereafter, maintains the high level until the terminal 224A is separated from the terminal 216A.

After time t21, at time t22, when the terminals 224A and 224B start to be separated from the terminals 216A and 216B, respectively, the DC voltage Vcc and the power supplied to the motor 226 start to decrease. The DC voltage Vdd also starts to decrease from 3.3 V toward 0 V. Similarly, the HP signal begins to drop. When DC voltage Vdd starts to decrease, the control circuit 2212 detects that the main power switch is turned off or that the connector 224 is removed from the connector 216. In response to the detection, the control circuit 2212 starts outputting of the low-level SW signal, stops outputting of the PWM signal, and further, initializes the timer ("0" in the drawing). The control circuit 2212 may start outputting of the low-level SW signal in response to the transition of the HP signal from the low level to the high level.

The load switch 229 disconnects the power line 228A in response to the transition of the SW signal from the high level to the low level. That is, the control circuit 2212 switches the load switch 229 from connection to disconnection in response to detection of removal of the connector 224 from the connector 216. Therefore, the motor 226 can be stably stopped.

Figure 7:
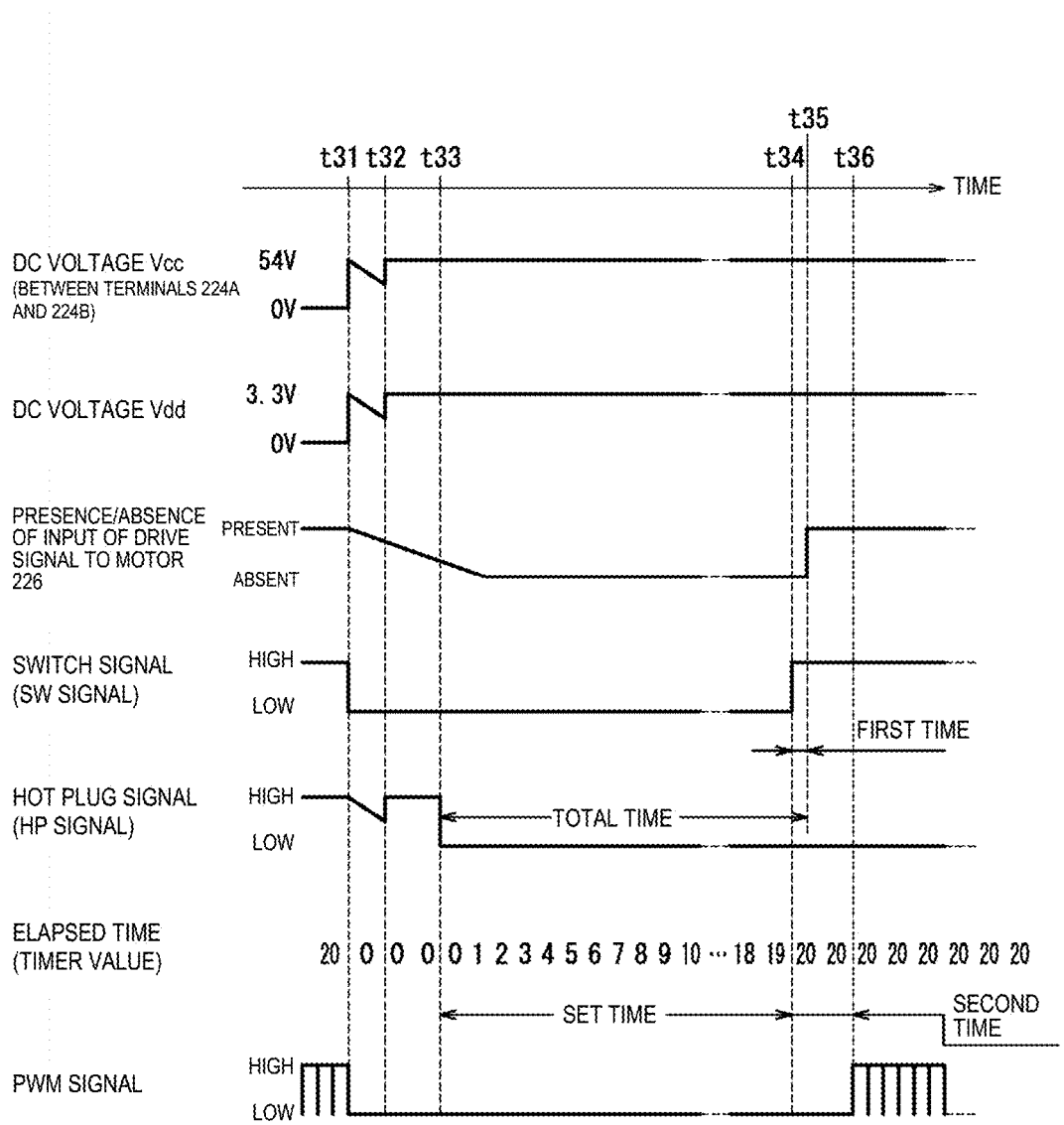
FIG. 7 is a timing chart illustrating operation of the pump assembly according to an example embodiment of the present disclosure when an operator attempts to remove the pump assembly from the casing and then reattaches the pump assembly to the casing.

FIG. 7 is a timing chart illustrating an operation of the pump assembly 22 when an operator attempts to remove the pump assembly 22 from the casing 21 and then reattaches the pump assembly 22 to the casing 21.

As illustrated in FIG. 7, at time t31, the control circuit 2212 detects that the connector 224 is removed from the connector 216, similarly to the case at time t22 (see FIG. 6). In response to the detection, the control circuit 2212 starts outputting of the low-level SW signal, stops outputting of the PWM signal, and further, initializes the timer. In addition, as the terminals 224A and 224B start to be separated from the terminals 216A and 216B, respectively, the DC voltage Vcc and the power supplied to the motor 226 start to decrease. The DC voltage Vdd also starts to decrease from 3.3 V toward 0 V. Similarly, the HP signal begins to drop.

After time t31, at time t32, the operator moves the pump assembly 22 to the mounting position P01 in the accommodation space 215 (see FIG. 2). As a result, among the terminals 224A, 224B, and 224C (see FIG. 3), the terminals 224A and 224B are electrically connected to the terminals 216A and 216B, respectively. As a result, the control circuits 227 and 2212 start operation by the DC voltage Vdd generated by the power supply unit 2213. In particular, the control circuit 2212 starts monitoring of the HP signal. When the DC voltage Vdd is input, the HP signal becomes a high level.

After time t32, at time t33, the control circuit 2212 starts clocking by the timer with detection of conduction of the terminals 216C and 224C as a trigger. The control circuit 2212 periodically monitors the time measured by the timer.

After time t33, at time t34, when the control circuit 2212 recognizes that the timer has reached a set time ("20" in the drawing), the control circuit 2212 outputs a high-level SW signal from the terminal 2212B. The drive unit 2211 gives a drive signal to the gate of the load switch 229 in response to the input of the high-level SW signal. Therefore, immediately after the drive signal is applied to the load switch 229, a current flows through the capacitor of the protection circuit 2210 and the capacitor is charged as described with reference to FIG. 4.

A time at which the first time has elapsed from time t33 is defined as t35. When the capacitor is fully charged or nearly fully charged at time t35, as described with reference to FIG. 4, the load switch 229 is switched to connection, and the DC voltage Vcc is applied between the gate and the source of the MOSFET of the load switch 229 and to the terminals 225A and 225B of the drive unit 225.

Further, a time at which the second time has elapsed from time t33 is defined as t36. At time t36, the control circuit 2212 starts to provide the PWM signal to the control circuit 227 as described with reference to FIG. 4.

The example embodiments of the present disclosure are described above with reference to the drawings. However, the present disclosure is not limited to the above example embodiment, and can be implemented in various modes without departing from the gist of the present disclosure. Additionally, the plurality of elements disclosed in the above example embodiment can be appropriately modified. For example, a certain element of all elements shown in a certain example embodiment may be added to a element of another example embodiment, or some elements of all elements shown in a certain example embodiment may be removed from the example embodiment.

The drawings schematically show each element mainly in order to facilitate understanding of the present disclosure, and the thickness, length, number, interval, and the like of each element that is shown may be different from the actual ones for convenience of the drawings. The configuration of each element shown in the above example embodiment is an example and is not particularly limited, and it goes without saying that various modifications can be made without substantially departing from the effects of the present disclosure.

The technology according to example embodiments of the present disclosure is suitable, for example, for cooling an electronic device.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A control device comprising:
   a first connector attachable to and detachable from an external device;
   a power supply path to electrically connect a load device and the first connector;
   a load switch to switch between connection and disconnection of the power supply path;
   a protection circuit to protect the load switch from an inrush current to the load switch; and
   a control circuit; wherein
   the control circuit is operable to output a drive signal to switch the load switch from disconnection to connection after a preset set time as a time until a connection state between the external device and the first connector is stabilized, which has elapsed since connection of the first connector to the external device was detected, and
   the protection circuit includes at least a capacitor and switches the load switch from disconnection to connection for a predetermined first time as a time for gradually transitioning the load switch from OFF to ON based on a charging time of the capacitor by the drive signal.

2. The control device according to claim 1, wherein the protection circuit is operable to switch the load switch from disconnection to connection by inputting a charging voltage of the capacitor to the load switch in the first time.

3. The control device according to claim 1, wherein the control circuit is operable to start outputting a drive signal to the load device when a second time longer than the first time elapses after the set time elapsed.

4. The control device according to claim 3, wherein the second time is shorter than the set time.

5. The control device according to claim 1, wherein
   the external device includes a second connector attachable to and detachable from the first connector;
   the second connector includes a second detection terminal to be grounded;
   the first connector includes a first detection terminal to be connected to the second detection terminal when the first connector is connected to the second connector; and
   the control circuit is operable to detect that the first connector is connected to the second connector on a basis of a voltage of the first detection terminal.

6. The control device according to claim 5, wherein the control circuit is operable to switch the load switch from connection to disconnection in response to detection of removal of the first connector from the second connector.

7. A pump assembly comprising:
   a first connector attachable to and detachable from an external device;
   a motor;
   a pump rotor that is rotatable by power generated by the motor;
   a power supply path electrically connected between the motor and the first connector;
   a load switch to switch between connection and disconnection of the power supply path;
   a protection circuit to protect the load switch from an inrush current to the load switch; and
   a control circuit to output a drive signal to switch the load switch from disconnection to connection after a preset set time as a time until a connection state between the external device and the first connector is stabilized, which has elapsed since connection of the first connector to the external device was detected; wherein
   the protection circuit includes at least a capacitor and switches the load switch from disconnection to connection for a predetermined first time as a time for gradually transitioning the load switch from OFF to ON based on a charging time of the capacitor by the drive signal, and
   the motor is operable to generate the power in response to the load switch being switched to connection.

8. A refrigerant circulation device comprising:
   the pump assembly according to claim 7; and
   a flow path through which refrigerant circulates by rotation of the pump rotor.

* * * * *